United States Patent
Peng

(10) Patent No.: US 7,379,375 B1
(45) Date of Patent: May 27, 2008

(54) MEMORY CIRCUITS HAVING DIFFERENT WORD LINE DRIVING CIRCUIT CONFIGURATIONS ALONG A COMMON GLOBAL WORD LINE AND METHODS FOR DESIGNING SUCH CIRCUITS

(75) Inventor: Tao Peng, Nashua, NH (US)

(73) Assignee: Cypress Semiconductor Corp., San Jose, CA (US)

( * ) Notice: Subject to any disclaimer, the term of this patent is extended or adjusted under 35 U.S.C. 154(b) by 203 days.

(21) Appl. No.: 11/247,945

(22) Filed: Oct. 11, 2005

Related U.S. Application Data

(60) Provisional application No. 60/629,416, filed on Nov. 19, 2004.

(51) Int. Cl.
*G11C 8/00* (2006.01)
(52) U.S. Cl. ............. 365/230.06; 365/194; 365/185.13
(58) Field of Classification Search ........... 365/230.06, 365/185.13, 194
See application file for complete search history.

(56) References Cited

U.S. PATENT DOCUMENTS

| | | | |
|---|---|---|---|
| 5,596,286 A * | 1/1997 | Houston | 326/33 |
| 5,602,785 A | 2/1997 | Casper | |
| 5,724,292 A | 3/1998 | Wada | |
| 5,917,365 A * | 6/1999 | Houston | 327/534 |
| 6,501,696 B1 | 12/2002 | Mnich et al. | |
| 6,538,932 B2 * | 3/2003 | Ellis et al. | 365/194 |
| 6,768,143 B1 * | 7/2004 | Fredeman et al. | 257/206 |
| 2005/0195672 A1 | 9/2005 | Lee | |

OTHER PUBLICATIONS

Seevinck et al., "Current Mode Techniques for High-Speed VLSI Circuits with Application to Current Sense Amplifier for CMOS SRAM's," IEEE Journal of Solid-State Circuits, vol. 26, No. 4, Apr. 1991, pp. 525-536.
Wong et al., "Design and modeling of tapered LWL architecture for high density SRAM," © 2004 IEEE, 3 pages.
U.S. Appl. No. 11/303,067, filed Dec. 14, 2005.
U.S. Appl. No. 11/262,412, filed Oct. 28, 2005.
U.S. Appl. No. 60/648,333, filed Jan. 28, 2005.
U.S. Appl. No. 11/380,333, filed Apr. 26, 2006.
U.S. Appl. No. 11/259,342, filed Oct. 24, 2005.
U.S. Appl. No. 10/870,289, filed Jun. 16, 2004.
U.S. Appl. No. 10/873,608, filed Jun. 29, 2004.

* cited by examiner

*Primary Examiner*—Richard T. Elms
*Assistant Examiner*—Eric Wendler
(74) *Attorney, Agent, or Firm*—Kevin L. Daffer; Daffer McDaniel, LLP

(57) ABSTRACT

Memory circuits having different configurations of local word line driving circuits (LWLDC) and methods for designing such circuits are provided. The memory circuits include an array of memory cells and a plurality of local word lines each coupled to a different subset of the array of memory cells. The memory circuit further includes a plurality of LWLDC respectively coupled to the plurality of local word lines, a global word line bus coupled to the plurality of LWLDC, and a global word line driving circuit (GWLDC) coupled to the global word line bus. At least one of the plurality of LWLDC may be configured to have a smaller amount of load capacitance than another LWLDC arranged comparatively farther from the GWLDC. In some embodiments, the variance of load capacitance may be induced by a variance of size among the plurality of LWLDC, specifically with reference to different transistor width dimensions.

21 Claims, 4 Drawing Sheets

MEMORY CIRCUITS HAVING DIFFERENT WORD LINE DRIVING CIRCUIT CONFIGURATIONS ALONG A COMMON GLOBAL WORD LINE AND METHODS FOR DESIGNING SUCH CIRCUITS

PRIORITY APPLICATION

The present application claims priority to provisional application No. 60/629,416 entitled "A Tapered Local Word Line Architecture for High Density SRAM" filed Nov. 19, 2004.

BACKGROUND OF THE INVENTION

1. Field of the Invention

This invention relates to semiconductor device manufacturing, and more particularly, to memory circuits having different local word line driving circuit configurations.

2. Description of the Related Art

The following descriptions and examples are not admitted to be prior art by virtue of their inclusion within this section.

In semiconductor memory devices, word lines are generally configured to provide address paths for an array of memory cells. In particular, word lines are often arranged orthogonal to bit lines with their intersections arranged at memory cells of an array. In order to access a particular memory cell, address information of the memory cell is applied along a word line coupled thereto and logic information is subsequently applied along a bit line coupled to the memory cell. The word lines used in such a capacity of the memory circuit are referred to herein as local word lines and may alternatively be referenced in the semiconductor industry as sub-word lines in some embodiments. A plurality of local word lines along a dimension of the memory array, such as those associated with a block of the memory array, may be coupled to the same signal propagation line to provide address information to a selected local word line. The signal propagation line common to the plurality of local word lines is referred to herein as a global word line and may be alternatively referenced in the semiconductor industry as a main word line.

Word line driving circuits are coupled to each of the local word lines and are configured to selectively allow and prohibit the propagation of a signal from the global word line to each of the local word lines coupled thereto. More specifically, each of the word line driving circuits are configured to selectively allow and disallow the transfer of a voltage pulse from the global word line to the respective local word line coupled thereto upon selection or deselection of control lines coupled to the local word line driving circuits. Consequently, the word line driving circuits serve as selection devices for the plurality of local word lines. Likewise, the global word line is generally equipped with a global word line driving circuit to allow and disallow the propagation of a signal along the global word line.

In general, the speed at which a particular memory cell may be addressed is dependent on, among other things, the resistance and capacitance values of the global word line circuit, the global word line, the word line driving circuit, and the local word line coupled to the block of memory cells comprising the particular memory cell. The lapse of time to induce signal propagation due to such resistance and capacitance values may generally be referred to as the RC delay of the address path. In conventional memory circuit designs, word line driving circuits for a given memory array have the same size and, thus, have the same associated resistance and capacitance values and resulting drive capability. Capacitance along interconnect lines, such as a global word line and local word lines, however, generally increase along the length of the lines, increasing the time needed to induce a voltage pulse from one end of the line to another. Consequently, the RC delay for an address path of a memory cell increases as its respective local word line and word line driving circuit are positioned farther from the global word line driving circuit. In effect, word line driving circuits positioned closer to the global word line driving circuit along the global word line may be asserted faster than those positioned farther from the global word line driving circuit.

Conventional memory circuit configurations are generally designed to accommodate a predetermined maximum RC delay such that the memory circuits may function in a practical amount of time and with relatively low power consumption. Such design configurations include sizing the global word line circuit, the global word line, the word line driving circuits, and the local word lines. For example, the word line driving circuits are generally sized such that the largest RC delays for the memory circuit (i.e., the RC delays along the address paths of the memory cells coupled to the word line farthest from the global word line driving circuit) are less than the predetermined maximum RC delay. In general, the capacitance of a word line driving circuit is inversely proportional with the size of the word line driving circuit and, as such, the word line driving circuits may be sized sufficiently large to accommodate the increasing capacitance at the end of the global word line. Large driving circuit sizes, however, undesirably occupy valuable die space, limiting the size of the memory array within the memory circuit. In addition, large driving circuits generally require larger operating currents and tend to generate larger standby leakage current, increasing the power consumption of the memory circuit.

Accordingly, it would be advantageous to develop a memory circuit which allows smaller word line driving circuits to be used for a given RC delay, a given number of memory cells coupled thereto, and a given size of a global word line coupled thereto. In addition, it would be beneficial to develop a memory circuit configuration which functions faster and with lower power consumption. Furthermore, it would be desirable to offer a memory circuit configuration which allows greater flexibility for increasing memory array size on a die.

SUMMARY OF THE INVENTION

The problems outlined above may be in large part addressed by memory circuits having different configurations of local word line driving circuits and methods for designing such circuits. The following are mere exemplary embodiments of the memory circuits and methods and are not to be construed in any way to limit the subject matter of the claims.

One embodiment of the memory circuits includes an array of memory cells and a plurality of local word lines each coupled to a different subset of memory cells of the array of memory cells. The memory circuit further includes a plurality of local word line driving circuits respectively coupled to the plurality of local word lines, a global word line bus coupled to the plurality of local word line driving circuits, and a global word line driving circuit coupled to the global word line bus. The plurality of local word line driving circuits include a first local word line driving circuit with a first set of transistors and a second local word line driving circuit with a second set of transistors having a layout common to the first set transistors. The transistors of the second set of transistors include different widths than corresponding transistors of the first set of transistors relative to the layout.

Another embodiment of the memory circuits includes an array of memory cells, a plurality of local word lines each coupled to a different subset of memory cells of the array of memory cells and a plurality of local word line driving circuits respectively coupled to the plurality of local word lines. In addition, the memory circuit includes a global word line bus coupled to the plurality of local word line driving circuits and a global word line driving circuit coupled to the global word line bus. At least one of the plurality of local word line driving circuits is configured to have a smaller amount of load capacitance than another of the plurality of local word line driving circuits arranged comparatively farther from the global word line driving circuit along the global word line bus.

An embodiment of the methods for designing a memory circuit includes outlining the memory circuit architecture to comprise an array of memory cells and a plurality of local word lines each coupled to a different subset of memory cells of the array of memory cells. The method further includes outlining the memory circuit architecture to have a plurality of local word line driving circuits respectively coupled to the plurality of local word lines, a global word line bus coupled to the plurality of local word line driving circuits, and a global word line driving circuit coupled to the global word line bus. Moreover, the method includes sizing at least two of the plurality of local word line driving circuits with respectively different transistor width dimensions.

BRIEF DESCRIPTION OF THE DRAWINGS

Other objects and advantages of the invention will become apparent upon reading the following detailed description and upon reference to the accompanying drawings in which.

Figure 1:
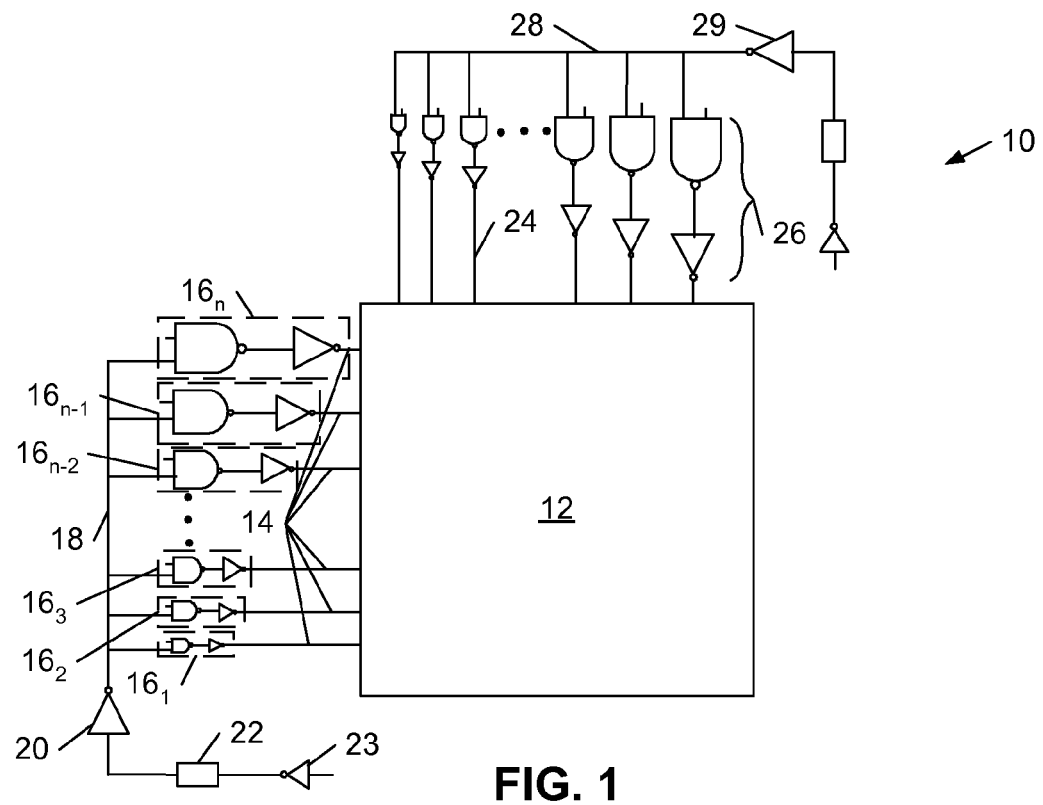
FIG. 1 depicts a schematic drawing of a memory circuit having local word line driving circuits of different sizes.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 2:
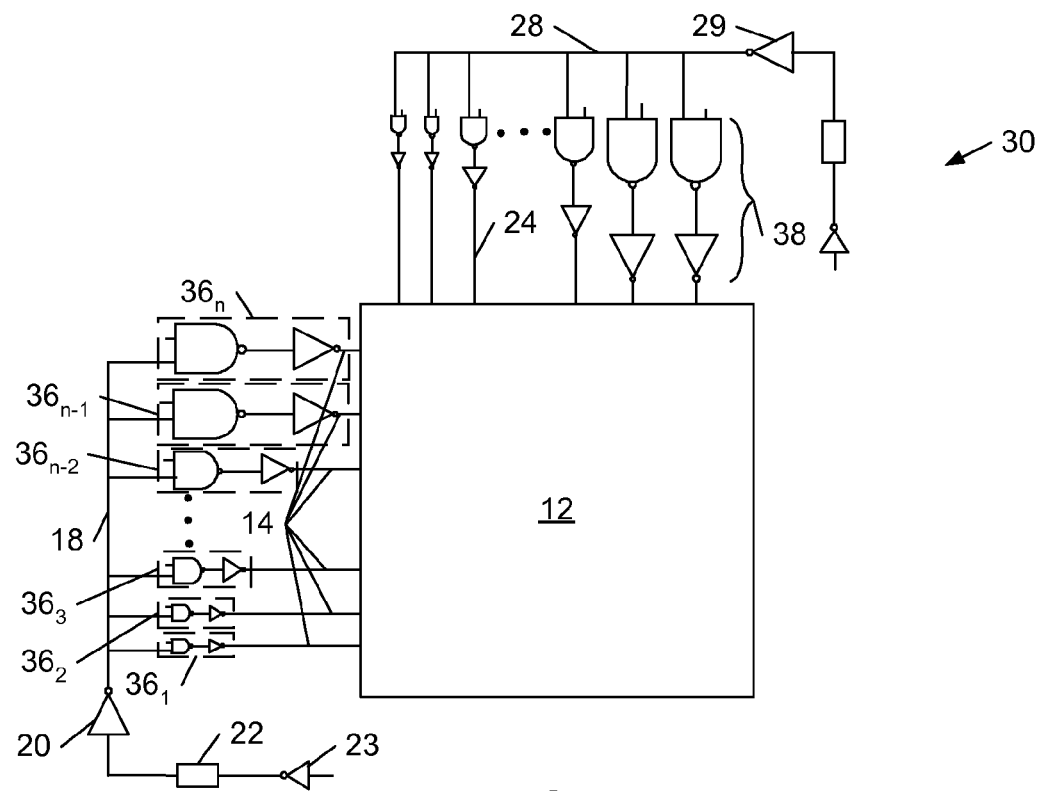
FIG. 2 depicts a schematic drawing of another memory circuit having local word line driving circuits of the same size and different sizes.
Figure 3:
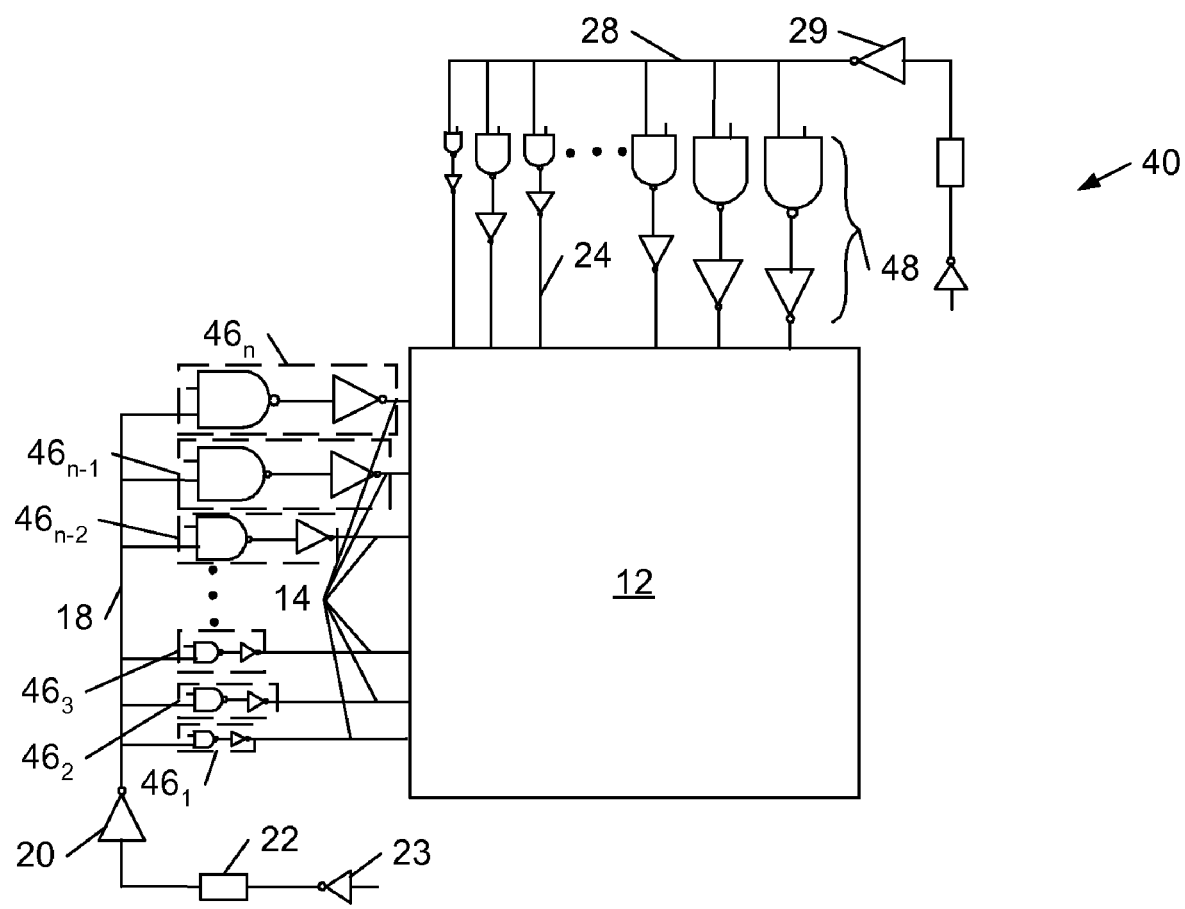
FIG. 3 depicts a schematic drawing of yet another memory circuit having local word line driving circuits of different sizes arranged disproportionate to their relative positions along a global word line bus.

Turning to the drawings, exemplary embodiments of memory circuits having different word line driving circuit configurations along a common global word line are shown in FIGS. 1-3. In particular, FIG. 1 illustrates memory circuit 10 having local word line driving circuits $16_1$-$16_n$ each having a different size and, more specifically, sized incrementally with respect to their position relative to global word line driving circuit 20. Since capacitance of local word line driving circuits is inversely related to the size of the circuits, memory circuit 10 illustrates an embodiment with local word line driving circuits having an ascending amount of load capacitance with respect to their distances from global word line driving circuit 20. As described in more detail below, varying the size of local word line driving circuits of a memory circuit will advantageously change the capacitance along a global word line coupled thereto, resulting in faster operation speeds and lower power consumption. A further benefit of varying the size of local word line driving circuits is that the total area occupied by the local word line driving circuits may be reduced relative to a conventional memory circuit having the same size memory array. The reduction in the use of die space lowers the operating current and standby leakage current, further reducing the power consumption of the memory circuit. In addition or alternatively, the reduction in the use of die space and the reduction of capacitance along the global word line may permit fabrication of a larger memory array, increasing the memory storage of the circuit.

Although memory circuit 10 depicted in FIG. 1 is specifically described as having local word line driving circuits $16_1$-$16_n$ sized in a tapered manner with respect to their position from global word line driving circuit 20, the memory circuits described herein are not so limited. In particular, local word line driving circuits $16_1$-$16_n$ may be sized in other manners. For example, local word line driving circuits $16_1$-$16_n$ may, in some embodiments, be sized with respect to a non-linear function relating their size and position from global word line driving circuit 20. In yet other cases, local word line driving circuits $16_1$-$16_n$ may be randomly sized with respect to their position from global word line driving circuit 20. In any case, the memory circuits described herein are not limited to having each of their local word line driving circuits sized differently. In particular, two or more of local word line driving circuits $16_1$-$16_n$ may be sized substantially the same. Furthermore, the memory circuits described herein are not limited to having local word line driving circuits sized progressively smaller toward a global word line driving circuit. In particular, a memory circuit may be fabricated with local word line driving circuit sizes which fluctuate between being larger and smaller relative to respective preceding local word line driving circuits along the global word line.

It is noted that any of the configurations described herein employing different sized local word line driving circuits may be incorporated into any type of memory circuit, including static random access memory (SRAM), dynamic random access memory (DRAM), magnetic random access memory (SAM), non-volatile random access memory (NV-RAM), and other memory types where two-level global word line and local word line (GWL/LWL) address decoding is normally employed. In addition, the configurations of memory circuits described herein may be incorporated into technologies of any size, including 90 nm technology and those which are larger and smaller.

As shown in FIG. 1, memory circuit 10 includes local word lines 14 respectively coupled between local word line driving circuits $16_1$-$16_n$ and memory array 12. In addition, memory circuit 10 includes global word line driving circuit 20 coupled to global word line bus 18, which in turn is coupled to local word line driving circuits $16_1$-$16_n$. To address a memory cell within memory array 12, an addressing signal enters inverter 23 and propagates through logic block 22 coupled to global word line driving circuit 20. Global word line driving circuit 20 propagates the signal along global word line bus 18 to one of local word line driving circuits $16_1$-$16_n$ upon selection by control lines coupled to the local word line driving circuits. The control lines are not shown in FIG. 1 to simplify the illustration of the memory circuit so that the size variation of local word line driving circuits $16_1$-$16_n$ may be emphasized. Other circuitry may also be included with memory circuit 10 but is not shown in FIG. 1 to simplify the drawing.

The number of local word lines 14 and local word line driving circuits $16_1$-$16_n$ corresponds to the number of n rows of memory cells within memory array 12, which may generally depend on the design specifications of memory circuit 10. Memory array 12 may include any grouping of memory cells of memory circuit 10, including a partial cluster of the memory cells often referred to as a memory array block or all of the memory cells. Continuation dots are respectively shown between local word lines 14 and local word line driving circuits $16_1$-$16_n$ in FIG. 1, indicating a progression of any number of such components with respect to the size of memory array 12. Local word line driving circuits $16_1$-$16_n$ are outlined by dotted lines in FIG. 1 to show their relative sizing variations and to denote the components included therein. The dotted lines, however, are not included within the circuit and, therefore, do not serve a function for the circuit. As shown in FIG. 1, local word line driving circuits $16_1$-$16_n$ may, in some embodiments, include NAND gates and inverter gates. Other configurations of local word line driving circuits known in the memory circuit industry, however, may be employed. In particular, the memory circuits described herein are not specific to the type of components used to configure the local word line driving circuits. As such, local word line driving circuits $16_1$-$16_n$ are not restricted to the inclusion of NAND gates and inverter gates as shown in FIG. 1 and, consequently, may additionally or alternatively include other type of logic components, such as but not limited to switches, multiplexors, and/or flip-flops.

In any case, the size of local word line driving circuits $16_1$-$16_n$ may generally be governed by the dimensions of transistors making up the logic components configured therein. In many embodiments, the lengths of logic component transistors are defined by the critical dimension specification of the memory circuit technology and, thus, are fixed. For instance, transistor lengths of logic components for 90 nm memory circuit technology are generally designed to be approximately 90 nm. As such, in many cases, the size of local word line driving circuits $16_1$-$16_n$ may generally be governed by the width dimensions of the transistors making up the logic components configured therein. In general, the length of a transistor may generally refer to the dimension of the gate line extending between source and drain regions disposed within the transistor diffusion region. On the contrary, the width of a transistor, as used herein, may refer to the dimension of a transistor gate line portion extending directly over a diffusion region of the transistor specifically along the direction which the gate line extends over isolation regions bordering the diffusion region. Hence, the width of a transistor may also be defined as the dimension of the gate line orthogonal to the transistor length.

As noted above and illustrated in FIG. 1, local word line driving circuits $16_1$-$16_n$ may each be sized differently and, thus, may have different size transistor dimensions and, in some embodiments, specifically have different size transistor width dimensions. Since capacitance of local word line driving circuits is inversely related to the size of the circuits, a variation of sizes among local word line driving circuits $16_1$-$16_n$ results in a variation of load capacitance among local word line driving circuits $16_1$-$16_n$. In some embodiments, transistor width dimensions for different logic components within a local word line driving circuit architecture common to local word line driving circuits $16_1$-$16_n$ may differ and, thus, a variation of width dimensions between corresponding transistors of the common local word line driving circuit architecture may better describe the size variations between local word line driving circuits $16_1$-$16_n$. For instance, the widths of each of the transistors within the inverter of one of local word line driving circuits $16_1$-$16_n$ may differ with corresponding transistors within the inverters of the other of local word line driving circuits $16_1$-$16_n$, and likewise for the NAND gates of local word line driving circuits $16_1$-$16_n$. The term "circuit architecture" may generally refer to the layout of components within the circuit, specifically the relative positions of transistors making up the components of the circuit regardless of their size. As such, a local word line driving circuit architecture common to local word line driving circuits $16_1$-$16_n$ as depicted in FIG. 1 may refer to a layout of relative positions of transistors of a NAND gate and an inverter.

Although it may be advantageous for each of local word line driving circuits $16_1$-$16_n$ to include the same circuit architecture in some embodiments to simplify the memory circuit design, the memory circuits described herein are not necessarily so limited. In particular, one or more of local word line driving circuits $16_1$-$16_n$ may include a different circuit architecture. In such cases, it is noted that the variation of load capacitance among local word line driving circuits $16_1$-$16_n$ is not limited to having size variations among corresponding transistors of a common circuit architecture. In particular, local word line driving circuits $16_1$-$16_n$ may additionally or alternatively include a variation of load capacitance by having one or more different circuit architectures among local word line driving circuits $16_1$-$16_n$, specifically circuit architectures designed to have a variation of load capacitance relative to each other. As such, variation of load capacitance among local word line driving circuits $16_1$-$16_n$ may not be limited to variations in transistor width dimensions.

In any case, local word line driving circuits $16_1$-$16_n$ may, in some embodiments, be configured to have a descending amount of load capacitance with respect to their distances from global word line driving circuit 20 as insinuated by the ascending size of local word line driving circuits $16_1$-$16_n$ in FIG. 1. More specifically, local word line driving circuits $16_1$ may be configured to the largest amount of load capacitance among local word line driving circuits $16_1$-$16_n$ and local word line driving circuits $16_n$ may be configured to the smallest amount of load capacitance among local word line driving circuits $16_1$-$16_n$, with local word line driving circuits $16_2$-$16_{n-1}$ having a descending amount of load capacitance therebetween. In some embodiments, such a configuration may equate to local word line driving circuits $16_1$ being the smallest driving circuit, local word line driving circuits $16_n$ being the largest driving circuit, and local word line driving circuits $16_2$-$16_{n-1}$ arranged in order of ascending size therebetween. As noted above, however, variance of load capacitance may additionally or alternatively be incorporated by variance in the word line architectures of local word line driving circuits $16_1$-$16_n$.

In any case, a descent of load capacitance may counter the innate increase of capacitance along the length of global word line bus 18. In addition, since driving strength of a circuit generally increases with reductions of load capacitance, the driving strength of local word line driving circuits $16_1$-$16_n$ will gradually increase along the length of global word line bus 18 away from global word line driving circuit 20. As a result, the variation of capacitance (and, consequently, the RC delay) along the address paths to each of word lines 14 may be reduced and, in some cases, balanced. In addition, the longest RC delay among the address paths to each of word lines 14 may be reduced, which in turn, increases the speed of the memory circuit.

Furthermore, the descent of load capacitance among local word line driving circuits $16_1$-$16_n$ will inherently reduce the total capacitance along global word line bus 18 relative to a global word line bus of a conventional memory circuit having local word line driving circuits of the same load capacitance. As a consequence, power consumption of memory circuit 10 may be lower than such a conventional memory circuit. In addition, the size of the largest local word line driving circuit employed within a memory circuit may be reduced relative to a conventional memory circuit contributing to further reduction in power consumption and speed improvement. In preliminary testing of the memory circuit configurations described herein, a speed increase of approximately 7% relative to a conventional memory circuit of the same type and size employing local word line driving circuits of uniform size was realized. Smaller or larger speed improvements, however, may be achieved for other memory circuits, depending on the design specifications thereof. For example, larger speed improvements may generally be realized with process technologies having non-resistance dominated routing.

A further benefit of varying the size of local word line driving circuits within a memory circuit is that the total area occupied by the local word line driving circuits may be reduced relative to a conventional memory circuit having local word line driving circuits of the same size. The reduction of used die space lowers the operating current and standby leakage current, further reducing the power consumption of the memory circuit. In addition, the reduction in the use of die space and the reduction of capacitance along the global word line may permit more room for additional memory cells and longer local word lines and global word lines, which in turn allows the fabrication of a larger memory array, increasing the memory storage of the circuit. In preliminary testing of the memory circuit configurations described herein, a total area occupied by local word line driving circuits for a given size memory circuit was reduced by approximately 30% relative to a conventional memory circuit of the same type and size employing local word line driving circuits of uniform size. Smaller or larger reductions, however, may be achieved for other memory circuits, depending on the design specifications thereof.

In order to accommodate the reduced variation of RC delay incurred by the variation of load capacitance among local word line driving circuits $16_1$-$16_n$, bit line driving circuits 26 of memory circuit 10 may also be configured to have a variation of load capacitance along the length of data line bus 28. More specifically, bit line driving circuits 26 may be configured to have a descending amount of load capacitance along the length of data line bus 28 extending from data line driving circuit 29 to counter the increasing amount of load capacitance among local word line driving circuits $16_1$-$16_n$. In order to incorporate such a variation of load capacitance among bit line driving circuits 26, bit line driving circuits 26 may, in some embodiments, be sized in a descending order relative to their distances from data line driving circuit 29 as shown in FIG. 1. In addition or alternatively, one or more of bit line driving circuits 26 may include a different driving circuit architecture than the others of bit line driving circuits 26 to induce a variation of load capacitance.

In some embodiments, the gradients of load capacitance among local word line driving circuits $16_1$-$16_n$ relative to global word line driving circuit 20 may be the inverse of the gradients of load capacitance among bit line driving circuits 26 relative to data line driving circuit 29. In other embodiments, however, the load capacitance gradients of bit line driving circuits 26 may differ from the inverse of load capacitance gradients of local word line driving circuits $16_1$-$16_n$. In any case, the variation of load capacitance along bit line driving circuits 26 results in a variation of RC delay along address paths of bit lines 24 which counters the variation of RC delay along local word lines 14 induced by the configurations of local word line driving circuits $16_1$-$16_n$. In this manner, the sequence of applied signals from word lines 14 and bit lines 24 to the memory cells of memory array 12 may be similar to that of a conventional memory circuit.

In some embodiments, the variance of load capacitance and, thus, the variance of size in some cases of local word line driving circuits $16_1$-$16_n$ may be linear. In particular, the load capacitance/size among local word line driving circuits $16_1$-$16_n$ may differ by the same amount or, alternatively stated, may be tapered. In other embodiments, the variance of load capacitance/size of local word line driving circuits $16_1$-$16_n$ may be non-linear. More specifically, the load capacitance/size among local word line driving circuits $16_1$-$16_n$ may be related by a non-linear polynomial function, such as but not limited to a geometric progression or an exponential function. Regardless of linearity or non-linearity, the common variable relating the load capacitance/size of local word line driving circuits $16_1$-$16_n$ may, in some embodiments, be the physical distance (i.e., measurement of distance) the driving circuits are from global word line driving circuit 20. In other cases, the common variable relating the load capacitance/size of local word line driving circuits $16_1$-$16_n$ may be the relative position each of the driving circuits are to each other and to global word line driving circuit 20 such that the distance between the driving circuits does not have to be computed or measured. In yet other embodiments, the load capacitance/size of local word line driving circuits $16_1$-$16_n$ may not be related by a common function, but rather may differ randomly and, therefore, may be disproportionate relative to each other.

As shown in FIG. 1, memory circuit 10 is depicted as having each of local word line driving circuits $16_1$-$16_n$ sized differently and arranged in ascending order from global word line driving circuit 20 according to their sizes. The memory circuits described herein are not necessarily so limited. In particular, a memory circuit may have one or more local word line driving circuits of the same size, such as but not limited to the memory circuit illustrated in FIG. 2 and described in more detail below. In addition or alternatively, a memory circuit may have local word line driving circuit sizes which fluctuate between being larger and smaller relative to respective preceding local word line driving circuits along a global word line. An exemplary memory circuit with local word line driving circuits having a fluctuation of sizes is shown in FIG. 3 and described in more detail below. It is noted that the memory circuits described herein are not limited to the configurations depicted in FIGS. 1-3, but rather may have any combination of the local word line driving circuit sizes described in reference thereto as well as modifications to the circuits depicted in FIGS. 1-3 which are in accordance with the discussions herein to vary the load capacitance of local word line driving circuits along a global word line bus.

FIGS. 2 and 3 respectively illustrate memory circuits 30 and 40 having many of the same components as memory circuit 10 illustrated in FIG. 1. In particular, memory circuits 30 and 40 are shown having memory array 12, local word lines 14, global word line bus 18, global word line driving circuit 20, logic block 22, inverter 23, bit lines 24, global data line 28, and global data line driving circuit 29. The characteristics of such components may be the same as described for the components of memory circuit 10 with the same reference numbers and, therefore, are not repeated for the sake of brevity. Memory circuits 30 and 40 differ from memory circuit 10 in the configuration of their local word line driving circuits and bit line driving circuits. In particular, FIG. 2 illustrates memory circuit 30 including some of local word line driving circuits $36_1$-$36_n$ and some of bit line driving circuits 38 of the same size. More specifically, local word line driving circuits $36_1$ and $36_2$ and local word line driving circuits $36_{n-1}$ and $36_n$ are respectively shown having similar sizes. In addition, the bit line driving circuits closest to global data line driving circuit 29 and farthest from global data line driving circuit 29 are respectively shown having similar sizes.

As such, the memory circuits described herein are not limited to having all of the local word line driving circuits and bit line driving circuits included therein of different sizes. In some embodiments, the local word line driving circuits and/or bit line driving circuits of the same size in memory circuit 30 may include the same circuit architecture and, therefore, may exhibit similar load capacitances. Consequently, the memory circuits described herein are further not limited to having all of the local word line driving circuits and bit line driving circuits included therein with different load capacitances. Furthermore, as noted above, the variance of load capacitance among the local word line driving circuits and bit line driving circuits is not limited to size variation, but rather may be induced by differences in circuit architectures among the driving circuits. As such, driving circuits having variation in sizes may not have variation in load capacitance. For example, local word line driving circuits $36_2$ and $36_3$ are of different sizes, but may be configured with different circuit architectures such that their load capacitance is similar.

It is noted that embodiments including some local word line driving circuits and some bit line driving circuits of the same size and/or load capacitance are not restricted to those driving circuits closest to or farthest away from its respective global driving circuit as depicted in FIG. 2. In particular, any plurality of local word line driving circuits $36_1$-$36_n$ and any plurality of bit line driving circuits 38 may be of similar size and/or configured with a similar load capacitance. In addition, the driving circuits of similar size and/or having similar load capacitance do not have to be arranged adjacent to each other along the global bus line. For example, local word line driving circuits $36_2$ and $36_3$ may, in some embodiments, be similarly sized and/or configured with a similar load capacitance. Furthermore, having similar sized and/or similar load capacitances among local word line driving circuits $36_1$-$36_n$ does not necessarily render such configuration among bit line driving circuits 38 and vice versa. In particular, bit line driving circuits 38 or local word line driving circuits $36_1$-$36_n$ may alternatively be configured with all different sizes and/or load capacitances. Moreover, the relative selection of local word line driving circuits $36_1$-$36_n$ and bit line driving circuits 38 having similarities of size and/or load capacitance does not have to be the same. In particular, the fact that local word line driving circuits $36_1$ and $36_2$ and local word line driving circuits $36_{n-1}$ and $36_n$ may be sized similarly does not necessarily render bit line driving circuits 38 closest to and farthest away from global data line driving circuit 29 to have similar sizes, respectively.

FIG. 3 illustrates memory circuit 40 with local word line driving circuits $46_1$-$46_n$ and bit line driving circuits 48 having sizes which fluctuate between being larger and smaller relative to respective preceding driving circuits along their global bus lines. In addition, memory circuit 40 illustrates local word line driving circuits $46_1$-$46_n$ and bit line driving circuits 48 having disproportionate sizes. In particular, local word line driving circuits $46_2$ is shown in FIG. 3 being larger in size than either of local word line driving circuits adjacent thereto along global word line bus 18, namely local word line driving circuits $46_1$ and $46_3$. In addition, local word line driving circuits $46_{n-2}$-$46_n$ are shown in FIG. 3 disproportionately sized. Similar configurations are shown among bit line driving circuits 48 as well.

It is noted that the associated fluctuations and disproportions of load capacitance with the varying sizes may additionally or alternatively incorporated through variations of circuit architectures among local word line driving circuits $46_1$-$46_n$ and/or bit line driving circuits 48. Furthermore, it is noted that fluctuations and/or disproportions of size and/or load capacitance may be incorporated among any plurality of local word line driving circuits $46_1$-$46_n$ and/or bit line driving circuits 48 and, therefore, are not restricted to the selection of circuit positions depicted in FIG. 3. Moreover, having fluctuations and/or disproportions of size and/or load capacitance among local word line driving circuits $46_1$-$46_n$ does not necessarily render such configurations among bit line driving circuits 48 and vice versa. In particular, bit line driving circuits 48 or local word line driving circuits $46_1$-$46_n$ may alternatively be arranged in order of relative sizes and/or load capacitance with respect to their global driving circuits, such as described in reference to FIG. 1. In other embodiments, some of bit line driving circuits 48 and/or local word line driving circuits $46_1$-$46_n$ may be configured with similar sizes and/or load capacitances such as depicted in reference to FIG. 2.

Figure 4:
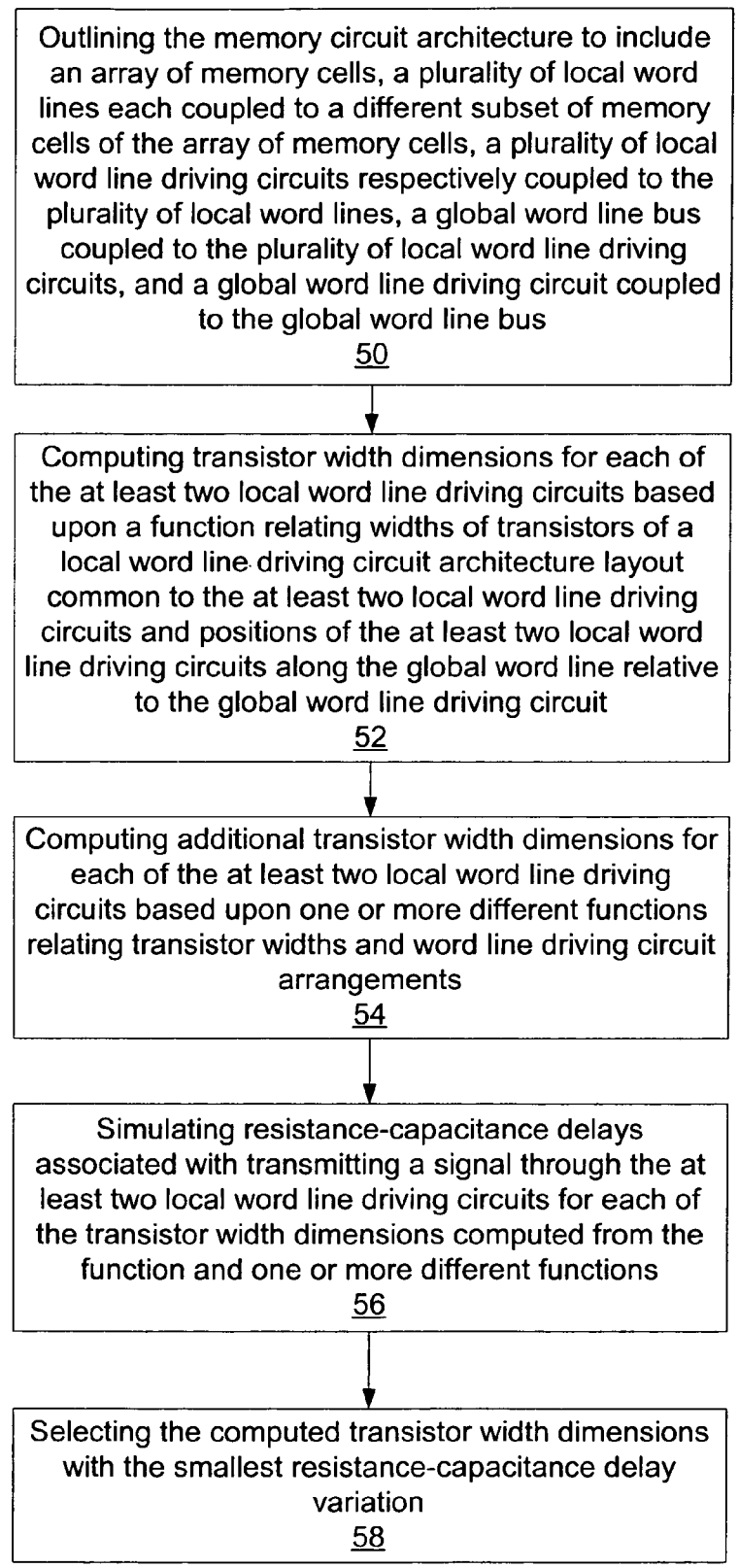
FIG. 4 depicts a flow chart for a method for designing a memory circuit having local word line driving circuits.

A method for designing memory circuits with configurations described herein is outlined in the flowchart depicted in FIG. 4. In particular, FIG. 4 illustrates block 50 in which a memory circuit is outlined to include, among other components, an array of memory cells and a plurality of local word lines each coupled to a different subset of memory cells of the array of memory cells. Block 50 further specifies outlining the memory circuit architecture to have a plurality of local word line driving circuits respectively coupled to the plurality of local word lines, a global word line bus coupled to the plurality of local word line driving circuits, and a global word line driving circuit coupled to the global word line bus. Such a memory circuit architecture is similar to the description of the components of memory circuits 10-30 described in reference to FIGS. 1-3.

The method outlined by the flowchart in FIG. 4 further includes sizing at least two of the plurality of local word line driving circuits with respectively different transistor dimensions, and in some cases, more specifically with respectively different transistor width dimensions. In some embodiments, the step of sizing may include arbitrarily assigning width dimensions to the at least two local word line driving circuits. In such cases, the step of sizing may, in some embodiments, further include altering the arbitrary sizes by trial and error to optimize the performance of the memory circuit. In other cases, however, the step of sizing may include computing transistor width dimensions for each of the at least two local word line driving circuits based upon a predetermined function as noted in block 52 of FIG. 4. More specifically, the step of sizing may include computing transistor width dimensions for each of the at least two local word line driving circuits based upon a function relating widths of transistors of a local word line driving circuit architecture layout common to the at least two local word line driving circuits and positions of the at least two local word line driving circuits along the global word line relative to the global word line driving circuit. The reference of the positions of the local word line driving circuits relative to the global word line driving circuit may either be the physical distance (i.e., measurement of distance) the driving circuits are from the global word line driving circuit or the relative position each of the driving circuits are to each other and to global word line driving circuit. In addition, the function may be a linear function or a non-linear function.

In some cases, the method of sizing the at least two local word line driving circuits with different transistor dimensions may be complete by the process outlined in block 52. As such, blocks 54-58 of the flowchart depicted in FIG. 4 may be omitted in some embodiments. In other embodiments, the method of sizing the at least two local word line driving circuits with different transistor dimensions may continue to block 54 in which additional transistor width dimensions are computed for each of the at least two local word line driving circuits based upon one or more different functions relating transistor widths and word line driving circuit arrangements. As with the function referenced in block 52, the different functions relate widths of transistors of a local word line driving circuit architecture layout common to the at least two local word line driving circuits and positions of the at least two local word line driving circuits along the global word line relative to the global word line driving circuit. In addition, the different functions may be linear or non-linear.

Subsequently, the functions and the transistor width dimensions computed therefrom may be compared to determine the optimum dimensions for the local word line driving circuits. The comparison may be performed in a variety of ways, one of which is outlined in blocks 56 and 58. In particular, block 56 specifies simulating resistance-capacitance (RC) delays associated with transmitting a signal through the at least two local word line driving circuits for each of the transistor width dimensions computed from the function and one or more different functions. In addition, block 58 specifies selecting the computed transistor width dimensions with the smallest RC delay variation denoted by the simulations. As will be described in more detail below in reference to FIG. 5, reducing RC delay variation equates to increasing the shortest RC delay and reducing the longest RC delay associated with the local word driving circuits. As such, the selection of transistor width dimensions associated with the smallest maximum resistance-capacitance delay may correspond to optimizing the speed of the memory circuit.

Figure 5:
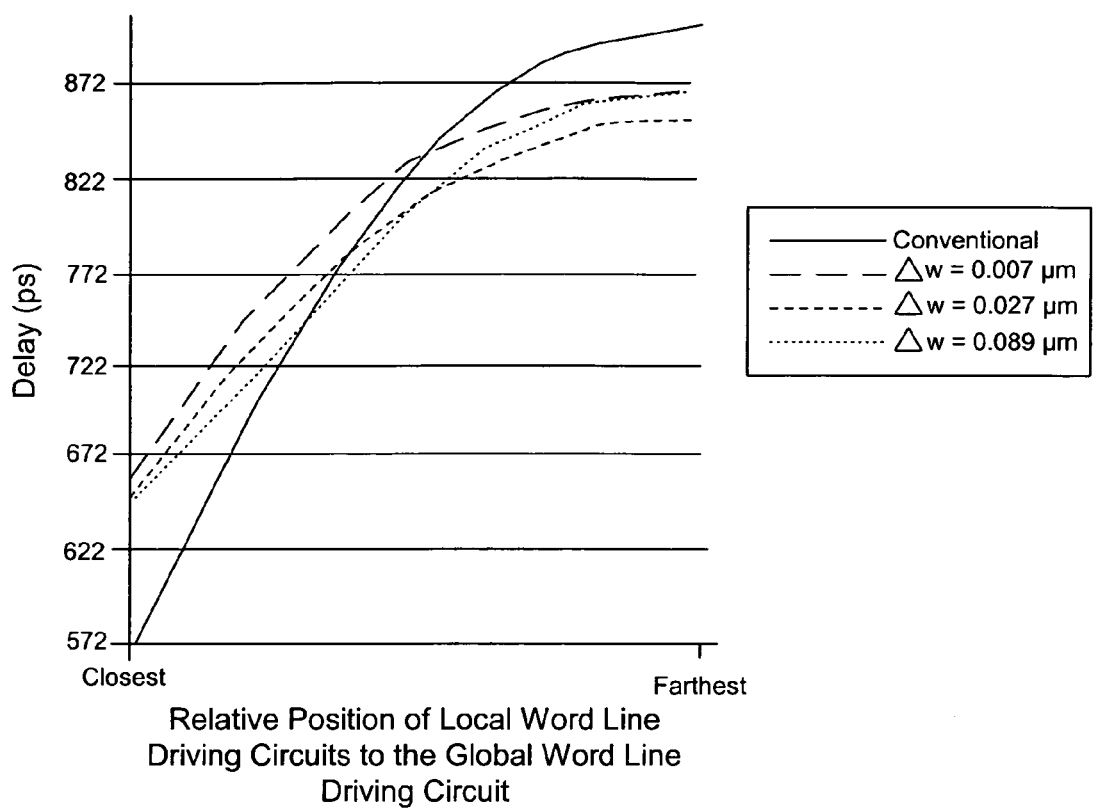
FIG. 5 depicts a plot of resistance-capacitance delays associated with transmitting signals along different words lines of multiple memory circuits with respect to positions of local word line driving circuits respectively coupled to the word lines along global word line buses of the memory circuits.

FIG. 5 illustrates an exemplary plot of simulated RC delays associated with transmitting a signal through a plurality of local word line driving circuits having a descending magnitude of load capacitance from its global word line driving circuit. In particular, FIG. 5 illustrates an exemplary plot of simulated RC delays associated with transmitting a signal through a plurality of local word line driving circuits arranged in a manner similar to that described in reference to FIG. 1. Furthermore, to illustrate the benefits of the configurations of local word line driving circuits described herein, FIG. 5 illustrates a plot of simulated RC delays associated with transmitting a signal through a conventional memory circuit of the same type and size having a plurality of local word line driving circuits of uniform size and load capacitance. In particular, the solid plotted line in FIG. 5 represents simulated RC delays associated with transmitting a signal through a conventional memory circuit.

In contrast, the dashed lines in FIG. 5 represent simulated RC delays associated with transmitting a signal through a memory circuit having a configuration of local word line driving circuits linearly related by different transistor width dimensions, the variations of which are noted in the graph legend. More specifically, the dashed lines in FIG. 5 represent simulated RC delays associated with a memory circuit having a configuration of local word line driving circuits linearly related by an equation of $W+i\Delta w$, wherein $W$ is the base transistor width (i.e. the transistor width from which transistor dimensions are augmented to increase the size of the local word line driving circuits), $i$ is the numeral associated with the position of the local word line driving circuit relative to the global word line circuit, and $\Delta w$ is the width gradient by which to augment the size of the local word line driving circuits along the global bus line. The base transistor width associated with each of the dashed lines in FIG. 5 is 0.74 microns and is particular to a NAND2 gate. Such a width, however, is exemplary and may be set at any dimension depending of the technology of the memory circuit and the design specifications of the components within the local word line driving circuits.

As shown in FIG. 5, the memory circuits having local word line driving circuits of differing sizes exhibit a smaller variation of RC delays than a conventional memory circuit having local word line driving circuits of uniform size. In particular, the local word line driving circuits closest to the global word line driving circuit contribute to longer RC delays than the conventional memory circuit configuration. In addition, the local word line driving circuits farthest from the global word line driving circuit contribute to shorter RC delays than the conventional memory circuit configuration. As a result, the longest RC delay among the address paths to each of word lines coupled to the local word line driving circuits may be reduced, which in turn, increases the speed of the memory circuit. Given the RC delay data of FIG. 5, the function exhibiting the smallest RC delay variation is the linear function having the width variations of 0.027 microns. As such, the transistor width dimensions associated with the function having the width variations of 0.027 microns may be selected to size a memory circuit. It is noted that the optimum function for selecting transistor width dimensions may vary with different design specifications of memory circuits, including the memory circuit size and type. As such, a linear function, much less one having width variations of 0.027 microns, may not be optimum for all applications.

Furthermore, plotting data is not necessarily needed to determine the RC delay variation of the different functions.

Figure 6:
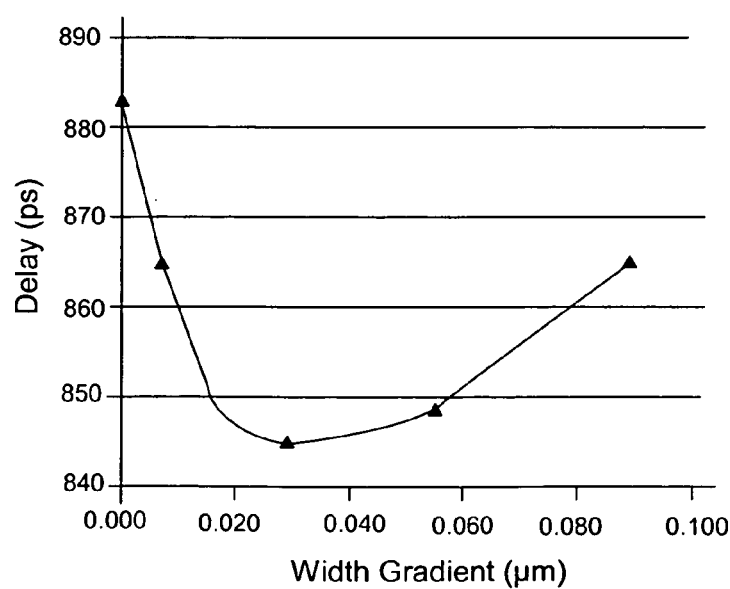
FIG. 6 depicts a plot of resistance-capacitance delays associated with transmitting a signal along a word line of a given memory circuit with respect to different width gradients of functions used to size a local word line driving circuit coupled to the word line.

An alternative method for determining the optimum function to use for sizing local word line driving circuits may include comparing the longest RC delay associated with the plurality of local word line driving circuits, which may typically be RC delay associated with the local word line driving circuit farthest from the global word line driving circuit, for each of the different functions. FIG. 6 illustrates an exemplary plot of data depicting such a technique. In particular, FIG. 6 illustrates a plot of RC delays associated with a local word line driving circuit arranged farthest from a global word line driving circuit of a memory circuit having a configuration of local word line driving circuits linearly related by different transistor width dimensions, the variations of which are noted along the x-axis of the graph. As shown in FIG. 6, the RC delay decreases as width gradients of functions increase until a minimum RC delay is reached. The RC delay associated with the selected local word line driving circuit then increases with larger width gradient of functions. The transistor widths associated with the function producing the shortest RC delay may be selected to optimize the speed of the memory circuit.

It is noted that methods described herein are well suited to including various other steps or variations of the steps recited herein, and in a sequence other than that depicted and/or described herein. In some cases, the methods may be carried out by computer processors or other electronic components to execute computer readable and computer executable instructions comprising code contained in a computer usable medium. It further noted that references throughout this specification to "one embodiment" or "an embodiment" means that a particular feature, structure or characteristic described in connection with the embodiment is included in at least one embodiment of the circuits and/or methods described herein. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A memory circuit, comprising:
   an array of memory cells;
   a plurality of local word lines each coupled to a different subset of memory cells of the array of memory cells;
   a plurality of local word line driving circuits respectively coupled to the plurality of local word lines, wherein the plurality of local word line driving circuits comprise:
   a first local word line driving circuit with a first set of transistors; and
   a second local word line driving circuit with a second set of transistors having a layout common to the first set transistors, wherein transistors of the second set of transistors comprise different channel widths than corresponding transistors of the first set of transistors relative to the layout;
   a global word line bus coupled to the plurality of local word line driving circuits; and
   a global word line driving circuit coupled to the global word line bus.

2. The memory circuit of claim 1, wherein the second local word line driving circuit is arranged farther from the global word line driving circuit along the global word line bus than the first local word line driving circuit, and wherein the transistors of the second set of transistors comprise larger channel widths than the corresponding transistors of the first set of transistors relative to the layout.

3. The memory circuit of claim 2, wherein the plurality of local word line driving circuits further comprises a third local word line driving circuit with a third set of transistors having the layout common to the first set transistors.

4. The memory circuit of claim 3, wherein the third local word line driving circuit is arranged farther from the global word line driving circuit along the global word line bus than the second local word line driving circuit, and wherein the transistors of the third set of transistors comprise larger channel widths than the corresponding transistors of the second set of transistors relative to the layout.

5. The memory circuit of claim 3, wherein the transistors of the third set of transistors comprise substantially equal channel widths as the corresponding transistors of one of the first and second sets of transistors relative to the layout.

6. The memory circuit of claim 4, wherein the channel widths of the transistors of the first, second, and third sets of transistors are proportional.

7. The memory circuit of claim 4, wherein the channel widths of the transistors of the first, second, and third sets of transistors are disproportionate.

8. The memory circuit of claim 4, wherein the plurality of local word line driving circuits further comprises additional local word line driving circuits each having a discrete set of transistors with the layout common to the first set transistors, and wherein the first, second, third, and additional local word line driving circuits are arranged in descending order along the global word line bus toward the global word line driving circuit with respect to different channel widths of the corresponding transistors of the first, second, third, and discrete sets of transistors.

9. The memory circuit of claim 8, wherein the first, second, third, and additional local word line driving circuits are consecutively arranged along the global word line bus.

10. A memory circuit, comprising:
    an array of memory cells;
    a plurality of local word lines each coupled to a different subset of memory cells of the array of memory cells;
    a plurality of local word line driving circuits respectively coupled to the plurality of local word lines;
    a global word line bus coupled to the plurality of local word line driving circuits; and
    a global word line driving circuit coupled to the global word line bus, wherein at least one of the plurality of local word line driving circuits is configured to have a smaller amount of load capacitance than another of the plurality of local word line driving circuits arranged comparatively farther from the global word line driving circuit along the global word line bus.

11. The memory circuit of claim 10, wherein each of the at least one and another word line driving circuits comprises a set of transistors having the substantially same layout, and wherein corresponding transistors of the sets of transistors comprise different channel widths relative to the layout.

12. The memory circuit of claim 10, wherein the plurality of local word line driving circuits are comparatively configured to have an ascending amount of load capacitance with respect to their distances from the global word line driving circuit.

13. The memory circuit of claim 11, wherein the channel widths of the corresponding transistors are linearly related to distances their respective local word line driving circuits are arranged along the global word line bus from the global word line circuit.

14. The memory circuit of claim 11, wherein the widths of the corresponding transistors are related by a non-linear function to the distances their respective local word line driving circuits are arranged along the global word line bus from the global word line circuit.

15. The memory circuit of claim 11, wherein the widths of the corresponding transistors differ randomly in relation to the distances their respective local word line driving circuits are arranged along the global word line bus from the global word line circuit.

16. The memory circuit of claim 12, further comprising:
a plurality of bit lines respectively coupled to the different subsets of memory cells;
a plurality of bit line driving circuits respectively coupled to the plurality of bit lines;
a data line bus coupled to the plurality of bit line driving circuits; and
a data line driving circuit coupled to the global word line bus, wherein the plurality of bit line driving circuits are comparatively configured to have a descending amount of load capacitance with respect to their distances from the global bit line driving circuit.

17. A method for designing a memory circuit architecture, comprising:
outlining the memory circuit architecture to comprise:
an array of memory cells;
a plurality of local word lines each coupled to a different subset of memory cells of the array of memory cells;
a plurality of local word line driving circuits respectively coupled to the plurality of local word lines;
a global word line bus coupled to the plurality of local word line driving circuits; and
a global word line driving circuit coupled to the global word line bus; and
sizing at least two of the plurality of local word line driving circuits with respectively different transistor channel width dimensions.

18. The method of claim 17, wherein the step of sizing comprises computing transistor width dimensions for each of the at least two local word line driving circuits based upon a function relating:
channel widths of transistors of a local word line driving circuit architecture layout common to the at least two local word line driving circuits; and
positions of the at least two local word line driving circuits along the global word line relative to the global word line driving circuit.

19. The method of claim 18, wherein the function comprises a linear function.

20. The method of claim 18, wherein the function comprises a non-linear function.

21. The method of claim 18, wherein the step of sizing further comprises:
computing additional transistor channel width dimensions for each of the at least two local word line driving circuits based upon one or more different functions relating transistor channel widths and word line driving circuit arrangements;
simulating resistance-capacitance delays associated with transmitting a signal through the at least two local word line driving circuits for each of the transistor channel width dimensions computed from the function and one or more different functions; and
selecting the computed transistor width dimensions with the smallest resistance-capacitance delay variation.

* * * * *